(12) United States Patent
Chaowasakoo et al.

(10) Patent No.: US 11,710,681 B2
(45) Date of Patent: Jul. 25, 2023

(54) SEMICONDUCTOR PACKAGES AND METHODS OF PACKAGING SEMICONDUCTOR DEVICES

(71) Applicant: UTAC Headquarters Pte. Ltd., Singapore (SG)

(72) Inventors: Tanawan Chaowasakoo, Bangkok (TH); Hua Hong Tan, Singapore (SG); Alexander Lucero Laylo, Bangkok (TH); Thanawat Jaengkrajarng, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 0 days.

(21) Appl. No.: 17/495,788

(22) Filed: Oct. 6, 2021

(65) Prior Publication Data

US 2022/0028762 A1 Jan. 27, 2022

Related U.S. Application Data

(62) Division of application No. 16/677,595, filed on Nov. 7, 2019, now Pat. No. 11,145,575.

(Continued)

(51) Int. Cl.
*H01L 23/495* (2006.01)
*H01L 23/31* (2006.01)
(Continued)

(52) U.S. Cl.
CPC .... *H01L 23/49513* (2013.01); *H01L 23/3128* (2013.01); *H01L 23/49517* (2013.01);
(Continued)

(58) Field of Classification Search
CPC ........ H01L 24/32; H01L 24/29; H01L 24/83; H01L 23/3107; H01L 23/49541; H01L 23/49513; H01L 23/49575; H01L 23/24; H01L 23/06; H01L 21/56; H01L 24/84; H01L 24/40; H01L 24/49; H01L 24/17;
(Continued)

(56) References Cited

U.S. PATENT DOCUMENTS

| 11,145,575 B2* | 10/2021 | Chaowasakoo ... H01L 23/49524 |
| 2007/0281397 A1* | 12/2007 | Lo ........................ H01L 21/561 |
| | | 438/123 |
| 2018/0240770 A1* | 8/2018 | Choi ................... H01L 23/4334 |

* cited by examiner

*Primary Examiner* — Alonzo Chambliss
(74) *Attorney, Agent, or Firm* — Horizon IP Pte. Ltd.

(57) ABSTRACT

An embodiment related to a device. The device includes a first die with first and second die surfaces. The second die surface is bonded to a first die attach pad (DAP) disposed on a first substrate surface of a package substrate and the first die surface includes a first die contact pad. The device also includes a first clip bond including a first clip bond horizontal planar portion attached to the first die contact pad on the first die surface, and a first clip bond vertical portion disposed on an edge of the first clip bond horizontal planar portion. The first clip bond vertical portion is attached to a first substrate bond pad on the first substrate surface. The device further includes a first conductive clip-die bonding layer with spacers on the first die contact pad of the first die. The first conductive clip-die bonding layer bonds the first clip bond horizontal planar portion to the first die contact pad, and the spacers maintain a uniform Bond Line Thickness (BLT) of the first conductive clip-die bonding layer.

20 Claims, 13 Drawing Sheets

Related U.S. Application Data

(60) Provisional application No. 62/757,132, filed on Nov. 7, 2018.

(51) Int. Cl.
*H01L 25/065* (2023.01)
*H01L 23/00* (2006.01)
*H01L 25/00* (2006.01)
*H01L 25/07* (2006.01)
*H01L 21/56* (2006.01)

(52) U.S. Cl.
CPC .. *H01L 23/49541* (2013.01); *H01L 23/49575* (2013.01); *H01L 24/17* (2013.01); *H01L 24/29* (2013.01); *H01L 24/32* (2013.01); *H01L 24/40* (2013.01); *H01L 24/49* (2013.01); *H01L 24/83* (2013.01); *H01L 24/84* (2013.01); *H01L 25/0652* (2013.01); *H01L 25/0657* (2013.01); *H01L 25/074* (2013.01); *H01L 25/50* (2013.01); *H01L 21/56* (2013.01); *H01L 23/3107* (2013.01); *H01L 2224/32245* (2013.01); *H01L 2224/8384* (2013.01); *H01L 2224/83815* (2013.01); *H01L 2224/8484* (2013.01); *H01L 2224/84815* (2013.01); *H01L 2924/181* (2013.01)

(58) Field of Classification Search
CPC ........... H01L 2924/181; H01L 23/3128; H01L 25/0562; H01L 25/074; H01L 25/50; H01L 25/0657
See application file for complete search history.

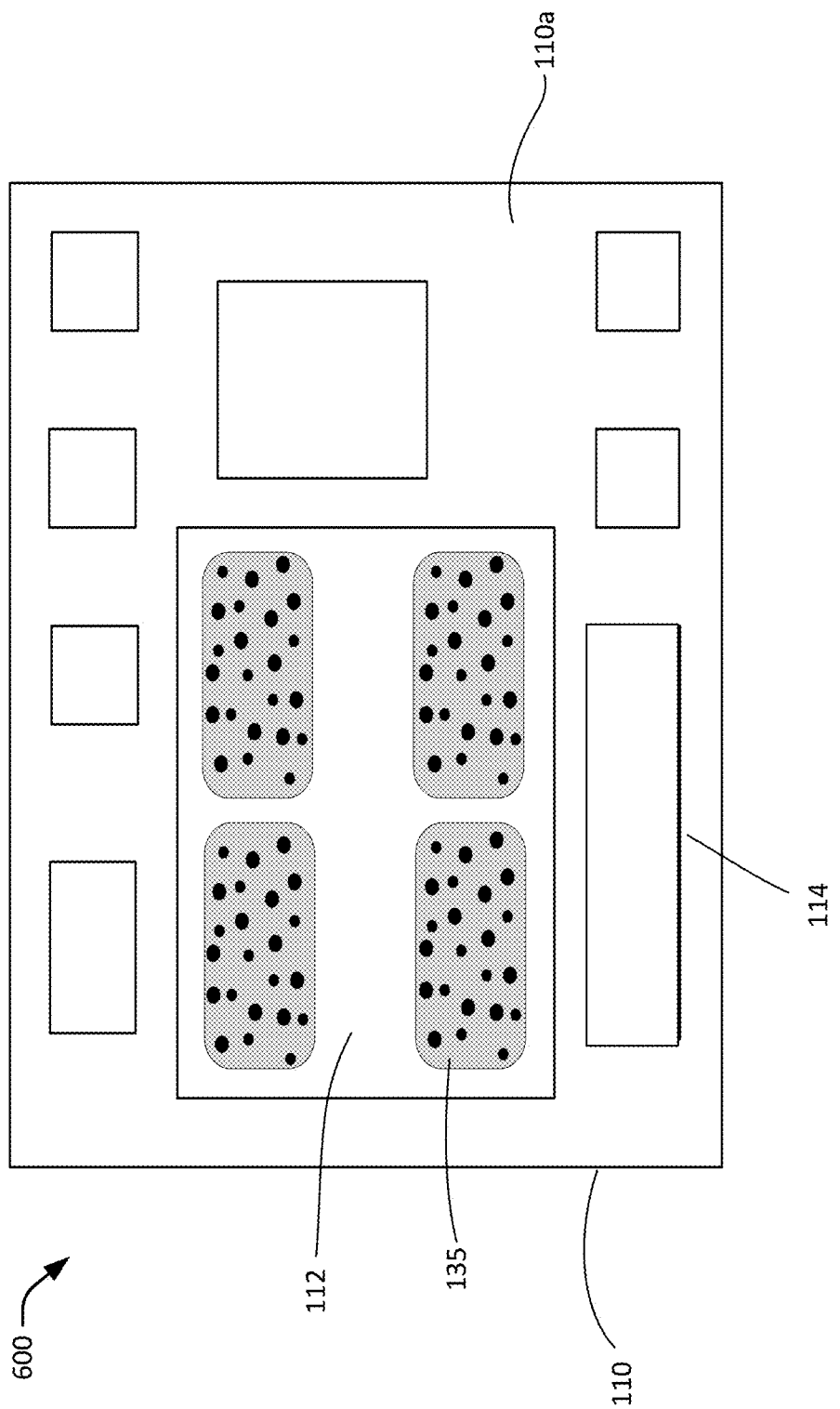

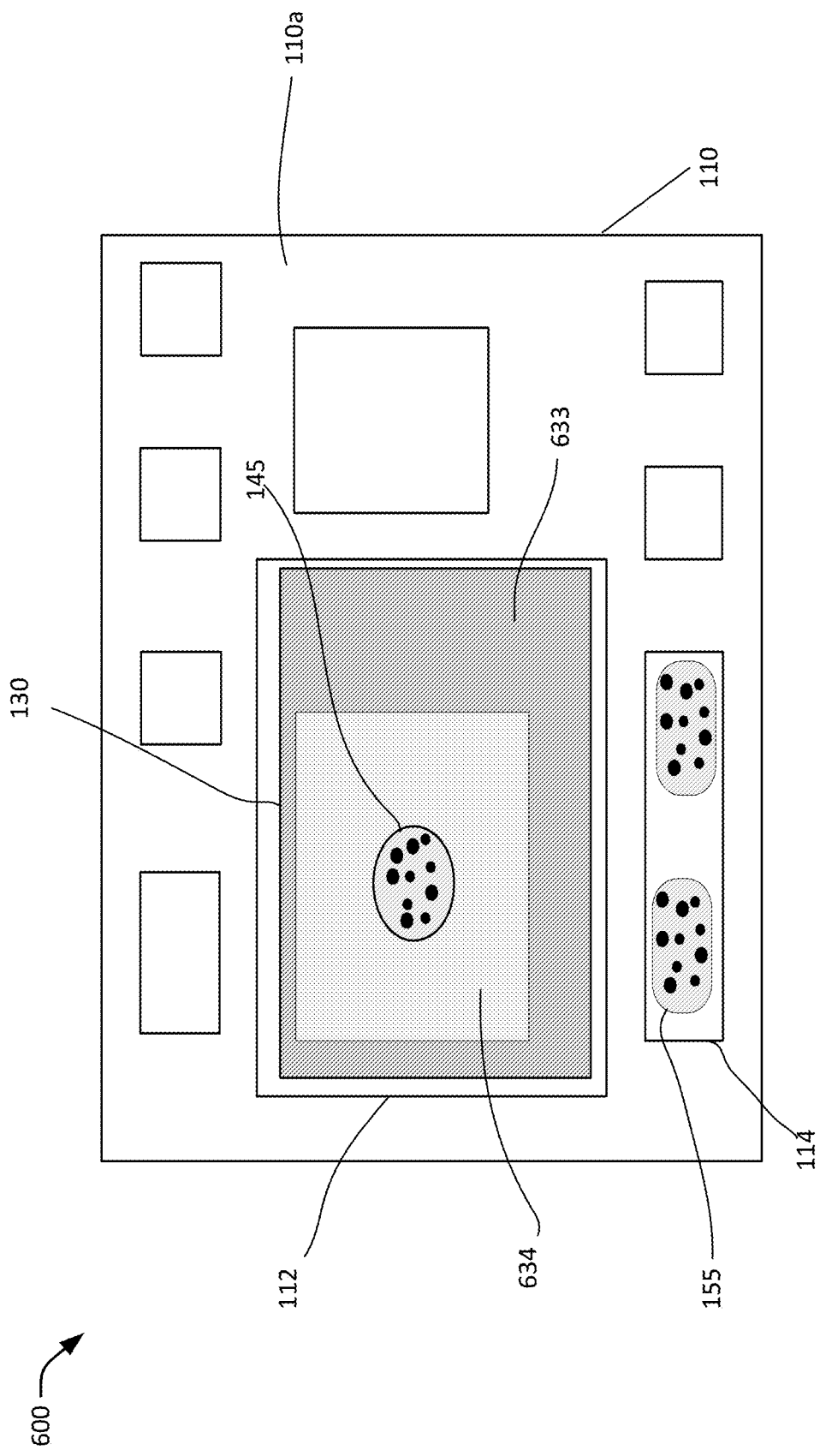

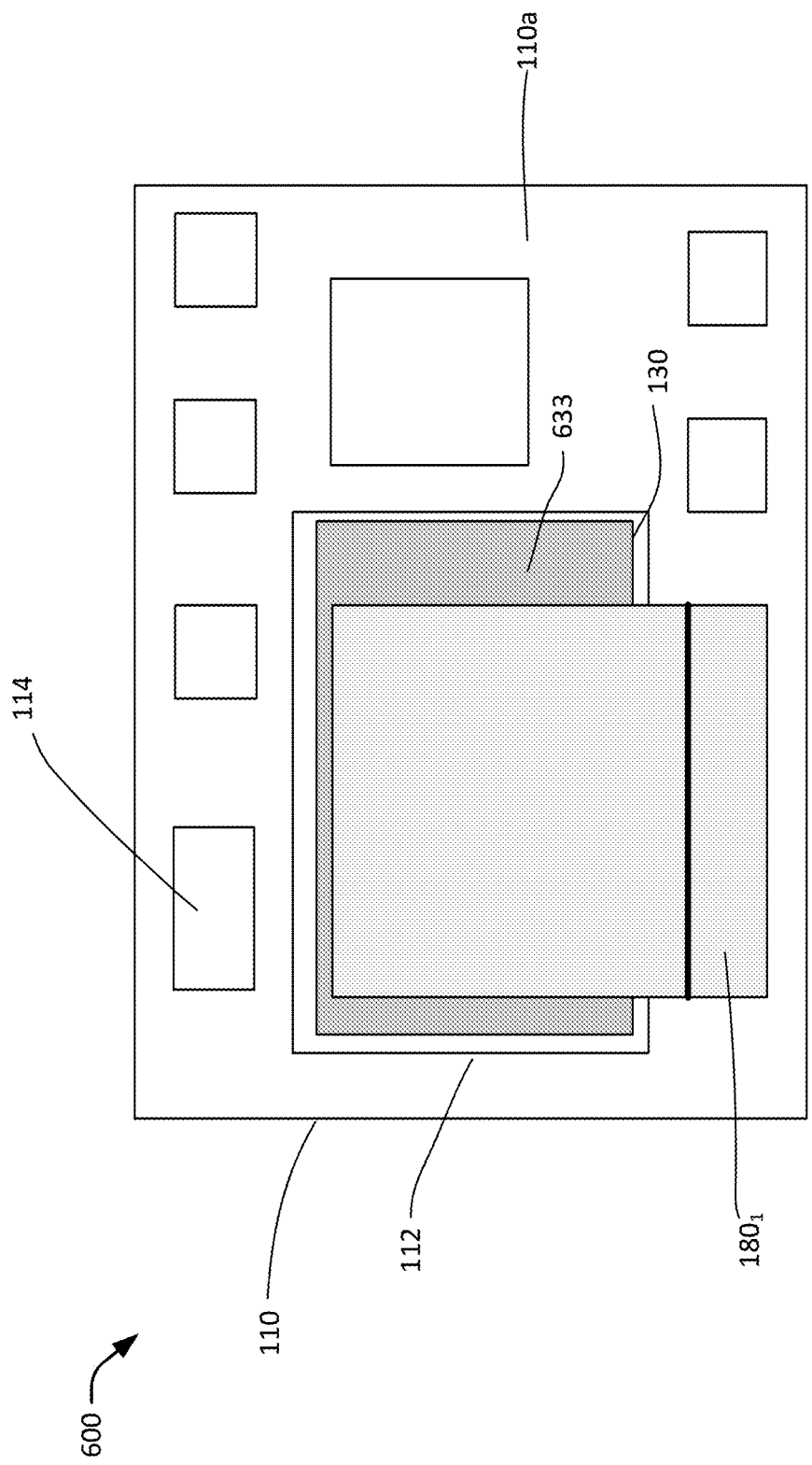

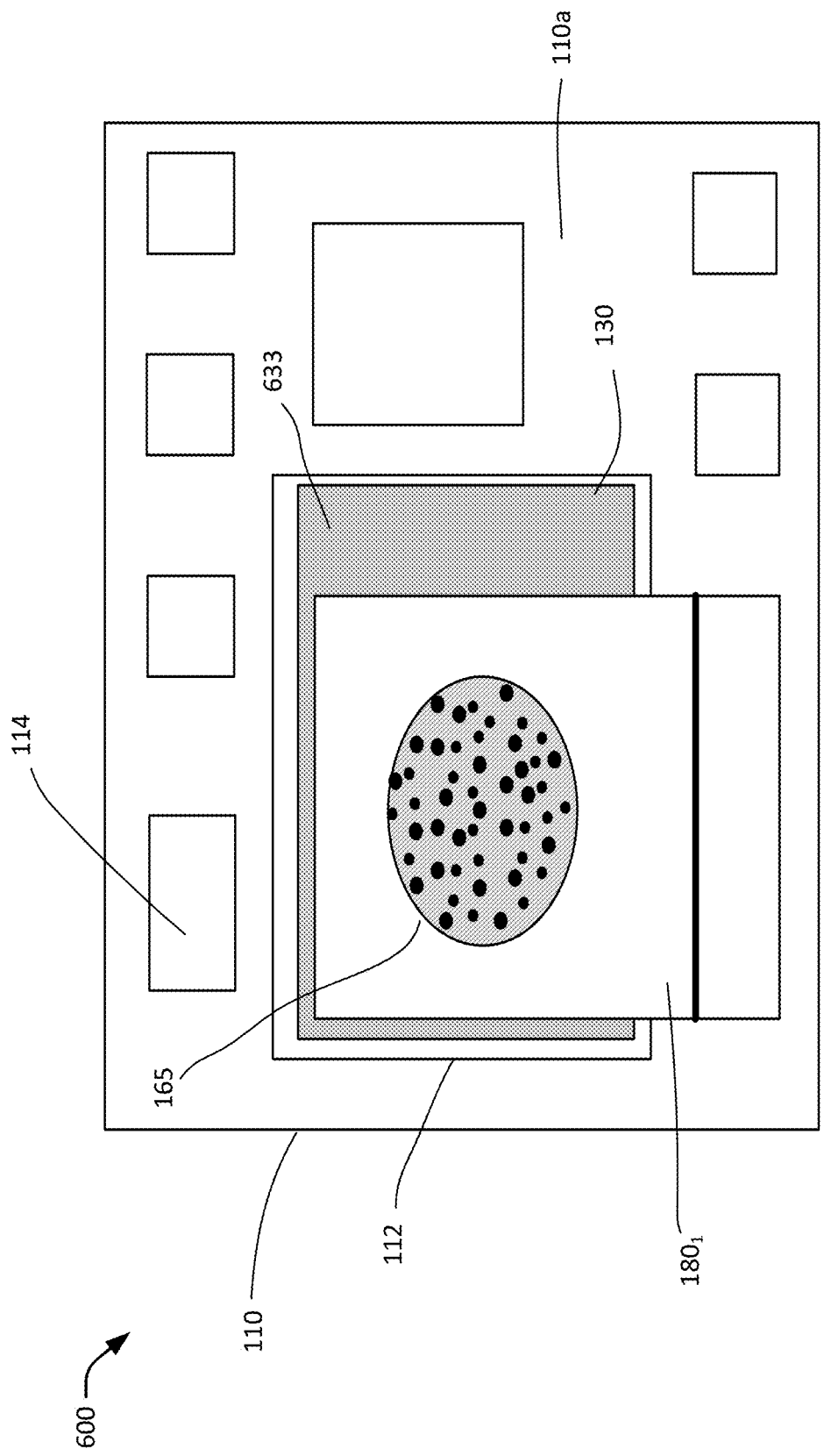

SEMICONDUCTOR PACKAGES AND METHODS OF PACKAGING SEMICONDUCTOR DEVICES

CROSS-REFERENCE TO RELATED APPLICATION

This application is a divisional application of co-pending U.S. patent application Ser. No. 16/677,595, filed on Nov. 7, 2019, which claims the benefit of U.S. Provisional Application Ser. No. 62/757,132, filed on Nov. 7, 2018, the disclosure of which are herein incorporated by reference in their entireties for all purposes.

FIELD OF THE INVENTION

The present invention generally relates to a semiconductor package. More specifically, the present invention is directed to a semiconductor package with uniform Bond Line Thickness (BLT).

BACKGROUND

The recent rapid dissemination of smartphones and other mobile and wearable electronic terminals reflects the demand for faster, thinner and smaller products that are more compact and power-efficient. To meet these requirements, Quad Flat No Lead (QFN) packaging is widely utilized to provide low costs, small footprints and low resistance between the top of the die and lead frame. Clips are used to replace traditional wire bond interconnects and provide lower resistance and inductance, improving speed and thermal performance.

There are problems associated with the clip packages. For example, it is challenging to maintain a uniform Bond Line Thickness (BLT) in each layer between different structures within the package. As a result, the clip structures and dies may tilt and contact with each other, causing electrical failures. In addition, cracks may be formed due to stress applied, smaller size or tilting, resulting in electrical failures as well.

From the foregoing discussion, there is a desire to provide a semiconductor package having substantially uniform BLT with improved electrical and thermal performance.

SUMMARY

An embodiment related to a device including a first die with first and second die surfaces. The second die surface is bonded to a first die attach pad (DAP) disposed on a first substrate surface of a package substrate and the first die surface includes a first die contact pad. The device also includes a first clip bond including a first clip bond horizontal planar portion attached to the first die contact pad on the first die surface, and a first clip bond vertical portion disposed on an edge of the first clip bond horizontal planar portion. The first clip bond vertical portion is attached to a first substrate bond pad on the first substrate surface. The device further includes a first conductive clip-die bonding layer with spacers on the first die contact pad of the first die. The first conductive clip-die bonding layer bonds the first clip bond horizontal planar portion to the first die contact pad, and the spacers maintain a uniform Bond Line Thickness (BLT) of the first conductive clip-die bonding layer.

Another embodiment is related to a device including a first die with first and second die surfaces. The second die surface is bonded, by a conductive die-substrate bonding layer, to a first die attach pad (DAP) disposed on a first substrate surface of a package substrate and the first die surface includes a first die contact pad. The device also includes a first clip bond including a first clip bond horizontal planar portion attached to the first die contact pad on the first die surface, and a first clip bond vertical portion disposed on an edge of the first clip bond horizontal planar portion. The first clip bond vertical portion is attached to a first substrate bond pad on the first substrate surface by a first conductive clip-substrate bonding layer. The device further includes a first conductive clip-die bonding layer with spacers on the first die contact pad of the first die and the first conductive clip-die bonding layer bonds the first clip bond horizontal planar portion to the first die contact pad, and a second die with first and second die surfaces. The second die surface is bonded to the first clip bond horizontal planar portion by a second conductive clip-die bonding layer with spacers and the first die surface includes a second die contact pad. The device also includes a second clip bond including a second clip bond horizontal planar portion attached to the second die contact pad on the first die surface, and a second clip bond vertical portion disposed on an edge of the second clip bond horizontal planar portion, the second clip bond vertical portion is attached to a second substrate bond pad on the first substrate surface. The device further includes a third conductive clip-die bonding layer with spacers on the second die contact pad of the second die. The third conductive clip-die bonding layer bonds the second clip bond horizontal planar portion to the second die contact pad.

In yet another embodiment, a device disclosed herein includes a first die with first and second die surfaces. The second die surface is bonded to a first die attach pad (DAP) disposed on a first substrate surface of a package substrate and the first die surface includes a first die contact pad. The device further includes a first clip bond having a horizontal planar portion attached to the first die contact pad on the first die surface, and a first conductive clip-die bonding layer with spacers on the first die contact pad of the first die. The first conductive clip-die bonding layer bonds the first clip bond horizontal planar portion to the first die contact pad, and the spacers maintain a uniform Bond Line Thickness (BLT) of the first conductive clip-die bonding layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-6h show top views of an embodiment of a process for forming a semiconductor package.

DETAILED DESCRIPTION

Embodiments relate to semiconductor packages and methods for forming the semiconductor packages. The semiconductor package is used to package one or more semiconductor dies or chips having an integrated circuit (IC). For the case of more than one semiconductor die, the semiconductor dies may be arranged in a planar arrangement, vertical arrangement, or a combination thereof. Such packages may be incorporated into electronic products or equipment, including vehicles.

Figure 1:
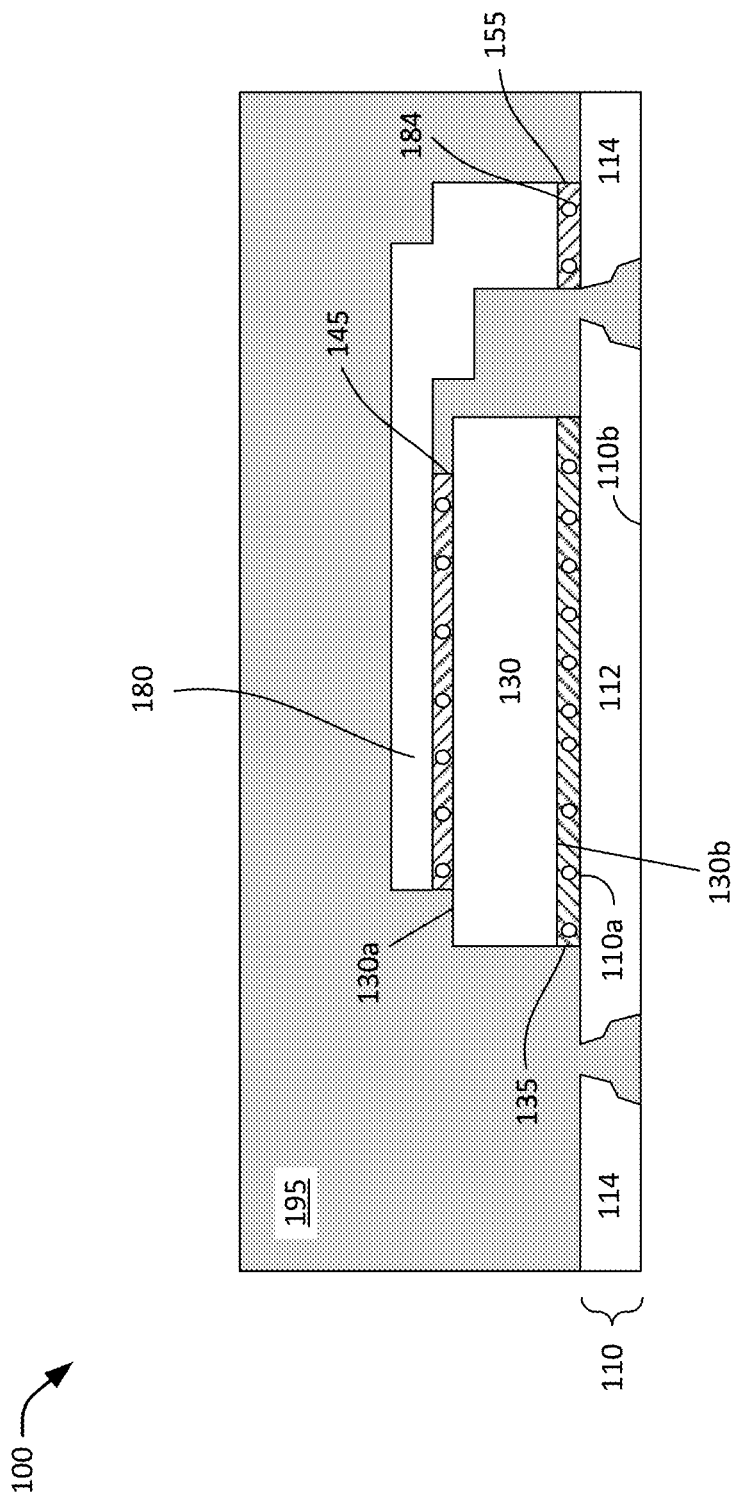
FIG. 1 shows a cross-sectional view of an embodiment of a semiconductor package.

FIG. 1 shows a simplified cross-sectional view of an embodiment of a semiconductor package 100. The semiconductor package 100 includes a package substrate 110 having a first major surface 110a and a second major surface 110b opposite to the first major surface. The first major surface 110a may be referred to as the top substrate surface and the second major surface 110b may be referred to as the bottom substrate surface. Other designations for the surfaces may also be useful.

In one embodiment, the package substrate 110 is an electrically conductive chip carrier configured for a lead frame based leadless package such as, but not limited to, a quad flat no-lead (QFN) package. Providing a package substrate for other types of packages may also be useful. The package substrate 110 may be, for example, a lead frame configured with a die-attach pad (DAP) 112 and one or more bond pads 114. Typically, there are more than one bond pads for terminals of the die. The number of bond pads may depend on the configuration of the die. The bond pads, for example, may be disposed around the DAP. Other configurations of bond pads and DAPs may also be useful. The lead frame 110 may be formed of a conductive material, such as copper (Cu) or an alloy thereof. Other suitable metals, such as aluminum (Al), nickel (Ni), silver (Ag), gold (Au), alloys thereof, or a combination thereof may also be used to form the lead frame 110.

A die may be attached to the DAP. As shown, the package substrate includes one DAP for attaching one die to the package substrate. Providing multiple DAPs for multiple dies may also be useful. For example, two DAPs may be provided for attaching two dies. Also, multiple dies can be configured in a stack configuration over a DAP. Other configurations of dies and DAP regions for the semiconductor package may also be useful.

The die, for example, may include a semiconductor substrate having an active or top surface with one or more circuit components formed thereon using front-end-of-line processes. Covering the circuit component may be a back-end-of-line (BEOL) dielectric layer with one or more metal layers for interconnecting the circuit component or components. A dielectric passivation layer may be disposed over the BEOL dielectric layer with openings to expose one or more top die contact pads to access the circuits. The top die contact pads may be formed of metal, such as Al. Other types of metal contact pads, such as Cu, may also be useful. The passivation layer with pad openings may serve as the active die surface.

In some embodiments, one or more through-silicon via (TSV) contacts may be provided through the substrate to provide one or more die contact pads on the bottom or inactive surface of the die. For example, one or more metal pads may be disposed on the inactive substrate surface exposed by a bottom passivation layer. The bottom surface may serve as the inactive die surface.

In one embodiment, the die may be a power MOSFET device. For example, the power MOSFET may be a three-terminal circuit with a source terminal, a gate terminal, and a drain terminal. In such cases, the active die surface may include two die contact pads, one for the source terminal and one for the gate terminal. As for the bottom die surface, it may include a drain contact pad, which is coupled to ground. The drain contact pad may occupy most of the inactive die surface. Other types of devices or configurations of the contact pads may also be useful. Typically, the size or surface area of a contact pad correlates with the power requirement of the terminal. For example, a terminal with a higher power requirement will be larger than a terminal with a lower power requirement.

In one embodiment, a bonding layer 135 is disposed on the DAP 112 to attach the die thereto. The bonding layer may be referred to as a die-substrate (die to substrate) bonding layer. As shown, the bonding layer completely fills the die attach region of the DAP. For example, the bonding layer is aligned with the edges of the die. The bonding layer should be configured to sufficiently bond the die to the die attach region of the DAP. Other configurations of the bonding layer on the die attach region may also be useful. For example, the bonding layer may be configured to extend slightly beyond the edges of the die or include multiple portions in the die attach region.

In one embodiment, the bonding layer 135 includes a conductive bonding material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful.

In one embodiment, the bonding layer 135 includes spacers 184. The spacers, as shown, are distributed throughout the bonding layer. The spacers, for example, are dispersed or distributed in the bonding layer. Providing the bonding layer with a non-uniform spacer distribution may also be useful. In one embodiment, the material of the spacers has a higher melting point than the conductive material of the bonding layer. The spacer material may be conductive or non-conductive, such as an insulating material. For example, the spacer material may include glass, metals, polymers, ceramics, silicon dioxide, alumina, boron nitride, or a combination thereof.

As shown, the spacers have a spherical shape. Other geometric shapes for the spacers may also be useful. Furthermore, it is not necessary that the spacers all have the same shape. The size of the spacers is limited to the Bond Line Thickness (BLT). For example, the spacers may have a size equal to or smaller than the BLT. For example, the spacers may have a size within 50-90% of the BLT. As shown, the spacers are uniformly sized and shaped spacers. Providing non-uniformly sized and/or non-uniformly shaped spacers may also be useful. In one embodiment, spacers smaller than a pre-determined size are allowed to pass through in a sleeving process. The BLT is controlled and maintained based on the required spacer size filler distribution.

In one embodiment, the die may be a power MOSFET device. For example, the power MOSFET may be a three-terminal circuit with a source terminal, a gate terminal, and a drain terminal. In such cases, the active die surface may include two die contact pads, one for the source terminal and one for the gate terminal. As for the bottom die surface, it may include a drain contact pad, which is coupled to ground. The drain contact pad may occupy most of the inactive die surface. Other types of devices or configurations of the contact pads may also be useful. Typically, the size or surface area of a contact pad correlates with the power requirement of the terminal. For example, a terminal with a higher power requirement will be larger than a terminal with a lower power requirement.

A clip bond 180 is provided to electrically couple the top die contact pad of die 130 to the bond pad 114 on the package substrate 110. The clip bond may include first and second portions configured to be coupled to the top die contact pad and to the bond pad. For example, the first portion is horizontal (along the plane of the major surfaces of the die) planar portion which is configured to be coupled to the top die contact pad and the second portion includes a vertical portion configured to couple to the bond pad. The vertical portion, for example, may extend towards the package substrate. The vertical portion may be perpendicular to the horizontal portion. Providing a vertical portion that is slanted (at an angle other than 90°) vis-à-vis the horizontal portion may also be useful. For example, the vertical portion may be slanted at an angle away from the edge of the die. Other profiles for the vertical portion may also be useful. For example, the vertical portion may include one or more steps to form a step profile. As shown, the vertical portion includes a step and continues perpendicularly to the horizontal portion towards the package substrate.

A bottom surface of the first portion (i.e., the surface facing the die) is coupled to the top die contact pad and a base surface of the second portion is coupled to the bond pad. Preferably, the base surface of the second portion is a horizontal planar surface. For example, the second portion may include a base having a planar base surface along the plane of the bond pad. Having a base surface that is angled, tilted or tapered may also be useful. In some embodiments, the base may include a horizontal extension portion, forming a foot portion of the base. The foot may serve to increase the bonding surface area to the bond pad. Other configurations of the base surface or base may also be useful.

In one embodiment, the clip bond is formed of a conductive sheet, such as a copper or copper alloy sheet. Other types of metal sheets may also be used to form the clip bond. In an alternative embodiment, the clip formed from a copper or copper alloy sheet is plated for better compatibility with a bonding layer. Another purpose for plating may be to minimize oxidation. The plating material may be silver. Other material for plating may also be useful. The conductive sheet may be shaped to have the desired top profile and bent to have the desired side profile. For example, the conductive sheet may be cut to include the desired top profile and bent to have the desired side profile. Forming the clip bond by other techniques may also be useful. For example, the clip bond may be formed by molding, stamping or from multiple parts bonded together to have the desired shape.

A conductive bonding layer 145 bonds the first portion of the clip bond to the top die pad. The bonding layer 145 may be referred to as the clip-die (clip to die) bonding layer. A conductive bonding layer 155 bonds the second portion of the clip bond to the bond pads of the package substrate. The conductive bonding layer 155 may be referred to as the clip-substrate (clip to substrate) bonding layer.

In one embodiment, the clip-die and clip-substrate bonding layers are the same or similar to the die-substrate bonding layer. For example, the bonding layer may be a conductive material with high thermal conduction, such as a solder paste or a sintering material. The bonding layer includes spacers distributed therein having a size that is equal or smaller than the BLT. For example, the spacers may have a size within 50-90% of the BLT. Preferably, the bonding layers may be formed of the same material. For example, the bonding layers may be a solder paste or the same type of sintering material. This enables a single process for completing the bonds of the bonding layers. For example, in the case of a sintering paste, a curing process is performed while a reflow process is performed for a solder paste. For a sintering paste, a curing process may be performed in either a curing oven or a reflow oven. In some cases, different types of bonding layers may be employed. However, separate processes would be needed to complete the bonds. In some embodiment, different materials are used in some bonding layers. For example, some die-substrate bonding layers do not have spacers.

In the case that the die includes multiple top die contact pads, multiple clip bonds may be provided. For example, one clip bond may be provided for each top die contact pad and bond pad pair, each bonded by a clip-die bonding layer and a clip-substrate bonding layer. The dimensions of the clip bonds, as well as die contact pads may differ based on power requirements. The bonding layers should be contained within their respective contact regions to avoid shorting with other contact regions due to overflow. For example, the clip-die bonding layers should be contained within the respective clip bonds.

The semiconductor package 100 includes a cap 195 having top and bottom planar surfaces. The cap may be configured with substantially vertical sidewalls, as shown in FIG. 1. The substantially vertical sidewalls of the cap are, for example, formed by a saw singulation process. In an alternative embodiment, the cap may be configured with sloped (or slanted) sidewalls. For example, the sidewalls of the cap slopes downwardly from the top planar surface to the bottom planar surface. The sloped sidewalls of the cap are, for example, formed by a punch singulation process. Other configurations of the cap may also be useful.

In one embodiment, the cap encapsulates the die and the clip bond or clip bonds. For example, the top planar surface of the cap extends above the clip bonds and semiconductor die. In one embodiment, the cap covers the top substrate surface of bond pads while exposing an outer sidewall and a bottom planar surface of the package substrate. Other configurations of the cap may also be useful. The cap 195 may be formed from an encapsulant material, such as a molding material. For example, the encapsulant material may be any suitable polymeric material such as epoxy and polyimide resin. Other types of encapsulant material may also be useful. For example, the cap may also include silicon, plastic or ceramic material. The cap 195 protects the semiconductor die 130 from moisture in the semiconductor package environment.

Figure 2:
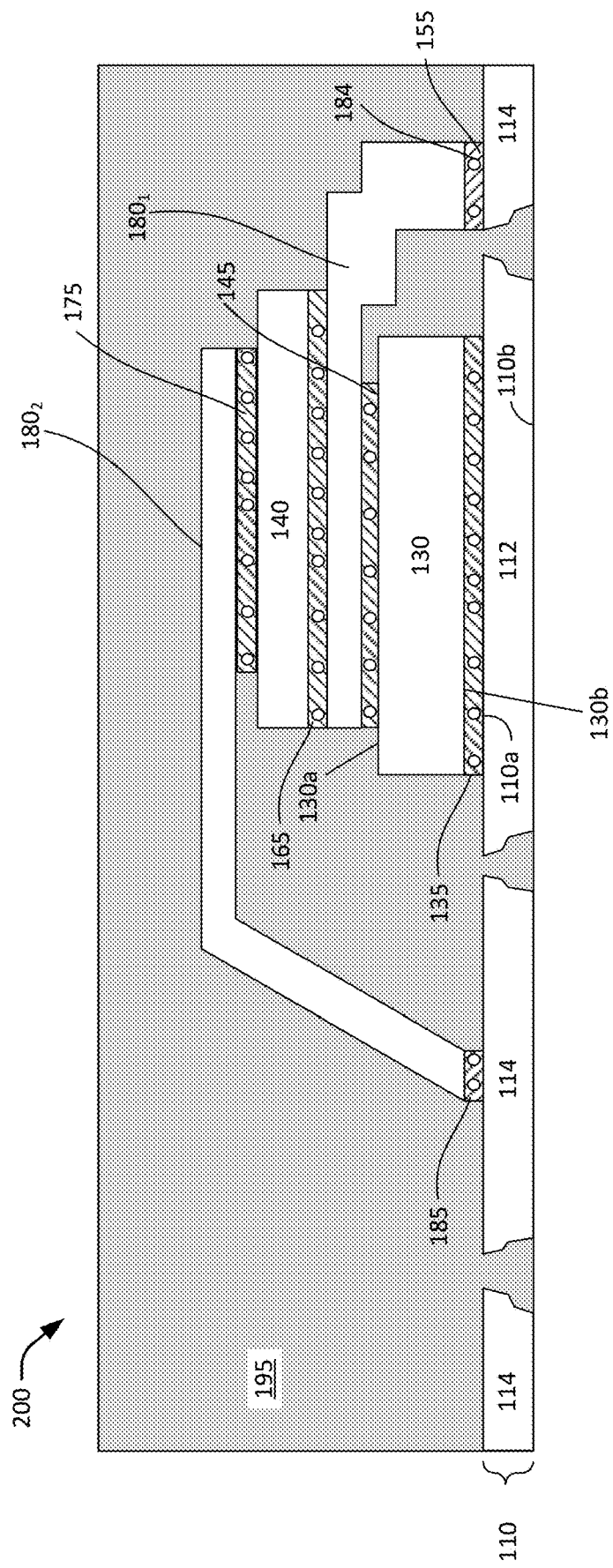
FIG. 2 shows a cross-sectional view of another embodiment of a semiconductor package.

FIG. 2 shows a simplified cross-sectional view of another embodiment of a semiconductor package 200. The semiconductor package 200 is similar to the semiconductor package described in FIG. 1. Common elements and features having the same reference numerals may not be described or described in detail. In the interest of brevity, the description of the semiconductor package shown in FIG. 2 primarily focuses on the difference(s) compared with the semiconductor package 100 shown in FIG. 1.

Referring now to FIG. 2, the semiconductor package 200 includes a stacked die configuration. For example, a second die 140 is stacked on top of a first die 130. Although as shown, the die stack is a two-die stack, providing a die stack having other number of dies may also be useful. The first die is attached to the DAP 112 of the package substrate using a die-substrate bonding layer 135 with spacers 184. A first clip bond 180₁ connects a top die contact pad to the bond pad on the package substrate. For example, a clip-die bonding layer 145 with spacers bonds the top die contact pad to the first clip bond and a clip-substrate bonding layer 155 with spacers bonds the clip bond to the bond pad. As discussed, although only one first clip bond is shown, there may be more than one first clip bonds, depending on the number of terminals on the first die.

A second die is attached to a top surface (i.e., the surface opposing the first die) of the first portion of the first clip bond by a bonding layer 165. The second die may be a power MOSFET. Other types of devices may also be useful. The bonding layer, for example, may be referred to as the die-clip (die to clip) bonding layer. The first clip bond, for example, provides a common signal to both the first and second dies.

A second clip bond 180₂ is provided to electrically connect the second die to the package substrate. The second clip bond, similar to the first clip bond, includes a horizontal portion and a vertical portion. The vertical portion may have any profile, as previously described. As shown, the vertical portion is slanted towards the package substrate. A second clip-die bonding layer 175 bonds the second clip bond to the second die and a second clip-substrate bonding layer 185 bonds the base of the second clip bond to a bond pad 114 of the package substrate. As shown, the vertical portions of the first and second clip bonds are disposed on opposite sides of the dies. Providing the vertical portion of the second clip bond on other sides, including the same side as the vertical portion of the first clip bond may also be useful. A cap 195 encapsulates the die stack and package substrate.

As shown, the bases of the vertical portions of the first and second clip bonds are bonded to the respective bond pads. Preferably, the base surfaces of the vertical portions are horizontal planar surfaces. For example, the bases may be planar surfaces along the planes of the bond pads. Having a base surface that is angled, tilted or tapered may also be useful. In some embodiments, the base may include a horizontal extension portion, forming a foot portion of the base. The foot may serve to increase bonding surface area to the bond pad. Other configurations of the base surface or base may also be useful.

Figure 3:
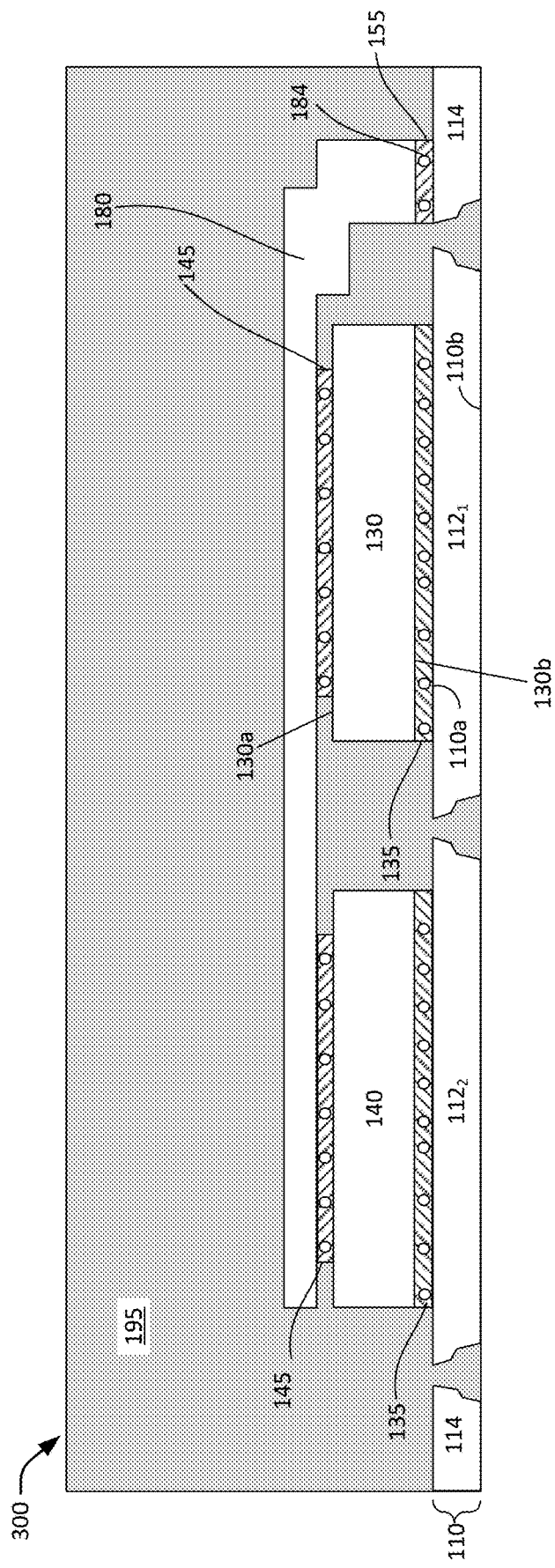
FIG. 3 shows a cross-sectional view of another embodiment of a semiconductor package.

FIG. 3 shows a simplified cross-sectional view of another embodiment of a semiconductor package 300. The semiconductor package 300 is similar to the semiconductor packages 100 and 200 described in FIGS. 1-2. Common elements and features having the same reference numerals may not be described or described in detail. In the interest of brevity, the description of the semiconductor package 300 shown in FIG. 3 primarily focuses on the difference(s) compared with the semiconductor packages shown in FIGS. 1-2.

Referring now to FIG. 3, the semiconductor package 300 includes a plurality of semiconductor dies disposed on respective DAPs 112 of a package substrate 110. For example, a first die 130 may be disposed on a first DAP 112₁ and a second die may be disposed on a second DAP 112₂. Providing other numbers of dies attached to the DAPs of the package substrate may also be useful. The dies, for example, are arranged side-by-side in a row arrangement. Arranging the dies on the package substrate in other configurations may also be useful.

A first and second die-substrate bonding layers 135 with spacers 184 are disposed on the top substrate surfaces 110a of the first and second DAPs 112₁ and 112₂ to attach the first and second dies thereto. For example, the dies are attached to the die attach regions of the DAPs.

A clip bond 180 commonly couples the first and second dies to the bond pad 114 of the package substrate 110. The clip bond includes a horizontal first portion and a vertical second portion which extends towards the package substrate. As shown, the second portion includes a step and extends perpendicularly with respect to the horizontal portion to the bond pad. As discussed above, other configurations of the vertical portion of the clip bond may also be useful. In one embodiment, first and second clip-die bonding layers 145 with spacers are provided over the die contact pads on top of the first and second dies for coupling the first clip portion thereto and a clip-substrate bonding layer 155 is provided on the base of the second clip portion to the bond pad.

In one embodiment, the dies may be power MOSFET dies having source, drain and gate terminals. Other types of dies may also be useful. For example, the drain terminal is disposed on the bottom of the die and the source and gate terminals are disposed on the top of the die. The drain terminals of the dies are coupled to the DAPs. The clip bond commonly couples, for example, the source terminals of the dies. Another clip bond (not shown) commonly couples the gate terminals of the dies to another bond pad on the package substrate. Other configurations for connecting the terminals of the dies to the package substrate may also be useful. The configuration may depend on, for example, the type of dies.

In addition, the clip bond structure enables direct soldering on the top surfaces of the semiconductor dies to possibly utilize larger top die contact pads of the semiconductor dies. This allows larger contact area and lower interconnect resistance between the top surfaces of the semiconductor dies and the lead frame compared to conventional wire bonding. Furthermore, the clip bond structure provides better thermal performance by providing efficient thermal dissipation from the top surfaces of the semiconductor dies to the lead frame. It helps to reduce the maximum junction temperature during operation and extend the operation life and reliability. In some embodiments, configurations including both wire bonds and clip bonds are employed.

Figure 4:
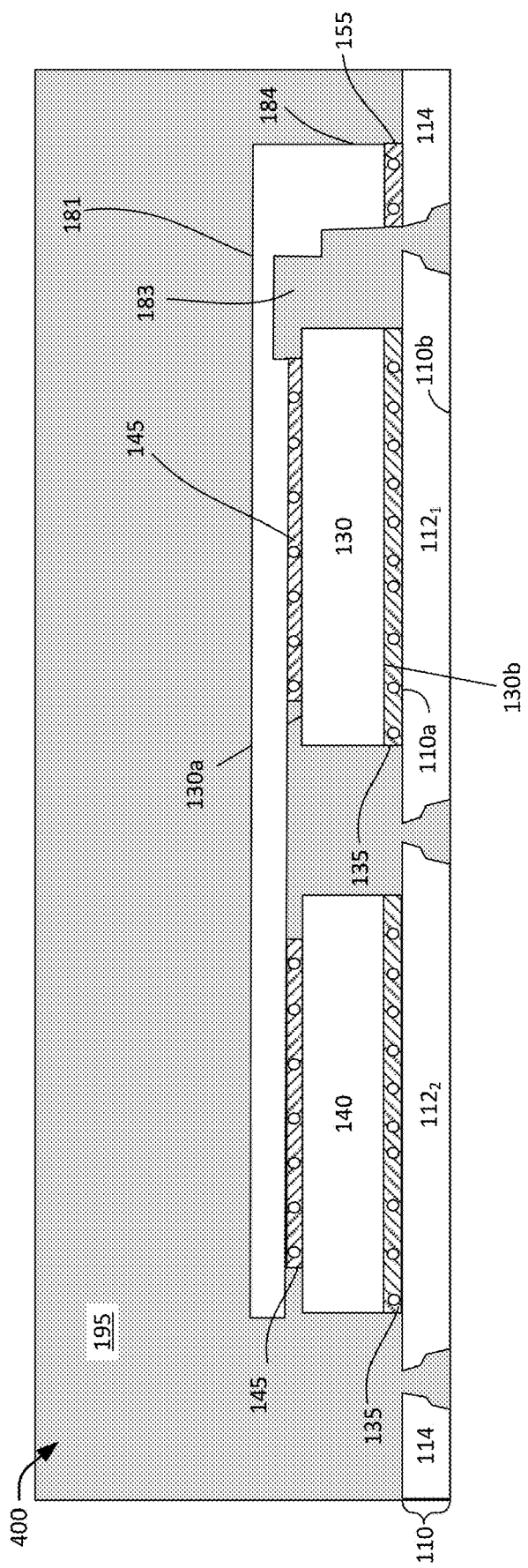
FIG. 4 shows a cross-sectional view of another embodiment of a semiconductor package.

FIG. 4 shows a simplified cross-sectional view of another embodiment of a semiconductor package 400. The semiconductor package is similar to the semiconductor packages described in FIGS. 1-3. Common elements and features having the same reference numerals may not be described or described in detail. In the interest of brevity, the description of the semiconductor package 400 shown in FIG. 4 primarily focuses on the difference(s) compared with the semiconductor packages shown in FIGS. 1-3.

In particular, the package 400 is the same or similar as that described in FIG. 3, except for the clip bond. As shown, the clip bond 181 is similar to the clip bond of FIG. 3 except that it includes a recess 183 in the horizontal clip portion adjacent to the vertical clip portion. In addition, the edge of the recess forms a step in the vertical clip portion.

Figure 5:
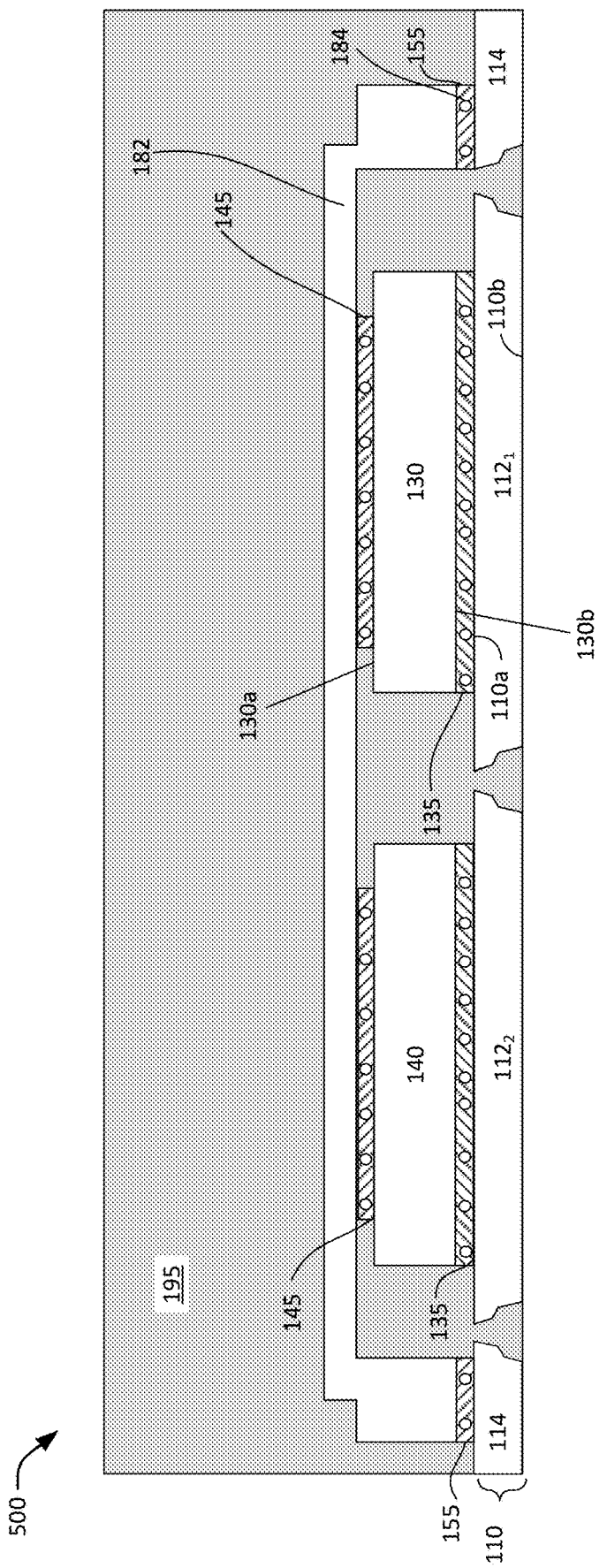
FIG. 5 shows a cross-sectional view of yet another embodiment of a semiconductor package.

FIG. 5 shows a simplified cross-sectional view of another semiconductor package 500. The semiconductor package is similar to the semiconductor packages described in FIGS. 1-4. Common elements and features having the same reference numerals may not be described or described in detail.

In the interest of brevity, the description of the semiconductor package shown in FIG. 5 primarily focuses on the difference(s) compared with the semiconductor packages shown in FIGS. 1-4.

In particular, the semiconductor package 500 is the same or similar as those described in FIGS. 3-4, except for the clip bond. As shown, the clip bond 182 is similar to the clip bond of FIGS. 3-4, except that it includes first and second vertical clip portions bonded to respective bond pads 114 on the package substrate 110 by clip-substrate bonding layers 155 with spacers.

FIGS. 6a-6h show simplified top views depicting an embodiment of a process for forming a semiconductor package 600. In one embodiment, the semiconductor package is a clip based semiconductor package, such as those described in FIGS. 1-5. Common elements may not be described or described in detail.

Figure 6A:
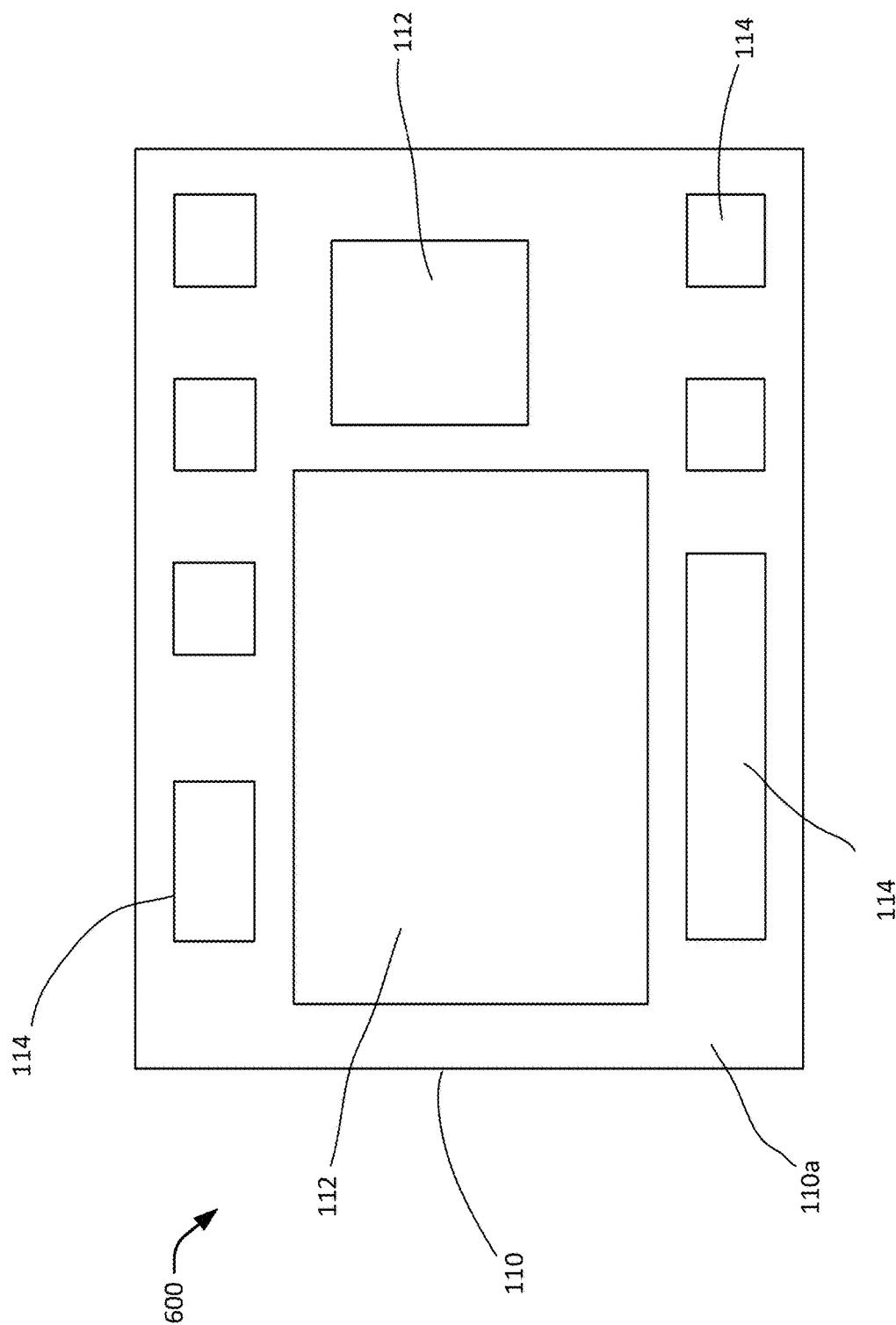

Referring to FIG. 6a, the process begins by providing a package substrate 110. The package substrate includes opposing top and bottom substrate surfaces. As the view is a top view, the top substrate surface 110a is shown. The package substrate serves as a chip carrier for the package. The substrate may be part of a lead frame based leadless package, such as a quad flat no-lead (QFN) package. Other types of packages may also be useful.

The substrate package includes at least one DAP 112 and bond pads 114 distributed thereon. As shown, the substrate package includes two DAPs and bond pads. The bond pads are distributed around the DAPs. Providing other numbers of DAPs for the package substrate may also be useful. As shown, DAPs are arranged in a row and the bond pads are distributed on opposing sides of the DAPs. Other configurations of DAPs and bond pads may also be useful. Although two DAPs are provided for the package substrate, the process will be described in the context of providing a single stack of two dies. In such a case, the package substrate would only need one DAP. For example, the package substrate provided may include only one DAP and bond pads. The use of multiple DAP package substrate for a single die or die stack may also be useful. It is understood that there can always be more DAPs on the package substrate than needed.

The package substrate is formed of a conductive material, such as Cu or alloys thereof. Other types of conductive materials or metals may also be useful to form the package substrate. For example, Al, Ni, Ag, Au, alloys thereof, or a combination thereof may also be used to form the package substrate. Although only one package substrate is shown, it is understood that the lead frame may include a plurality of package substrates. The package substrates of the lead frame may be configured in a strip, a row or in a matrix, having rows and columns of package substrates. The package substrate may be formed using various techniques. For example, the package substrate of the lead frame may be formed by stamping or etching.

In FIG. 6b, the process continues to deposit a bonding layer 135 with spacers on a DAP 112 of interest. For example, in this case, only one DAP will be mounted with a die, which is the DAP of interest. The bonding layer may be referred to as the die-substrate bonding layer. In one embodiment, the bonding layer is deposited on the DAP followed by the spacers. In another embodiment, a bonding layer premixed with spacers is deposited on the DAP. As shown, the bonding layer is deposited within the DAP. Further as shown, the bonding layer is deposited in multiple portions, such as four portions, within the DAP. Forming the bonding layer as a single portion or other numbers of portions may also be useful. In one embodiment, the bonding layer is screen printed onto the package substrate. For example, the bonding layer is screen printed onto the DAP of the package substrate. Other techniques for depositing the bonding layer may also be useful.

Figure 6C:
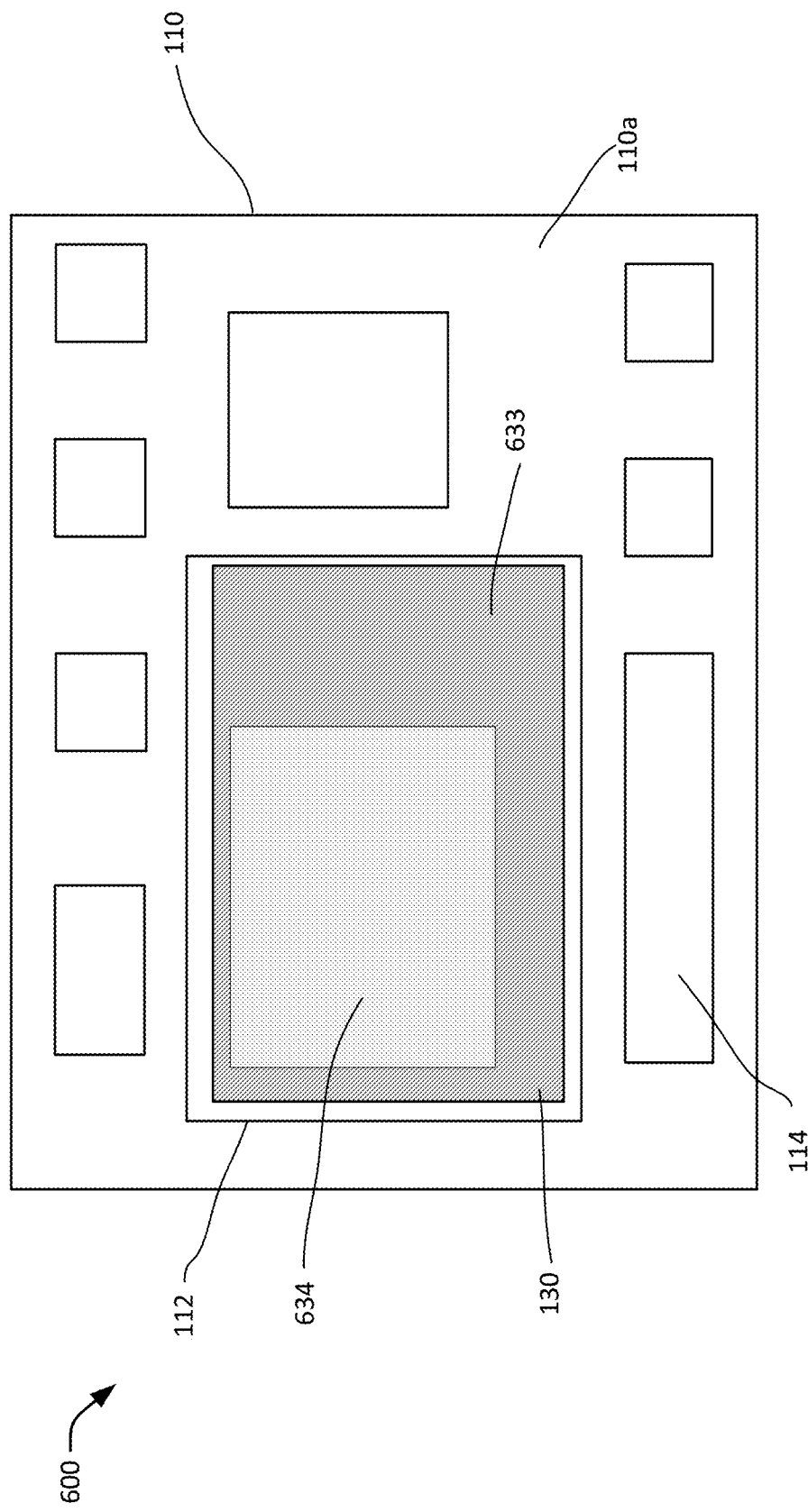

Referring to FIG. 6c, a die 130 is temporarily attached to the DAP via the conductive bonding layer. In one embodiment, a subsequent process needs to be performed to permanently bond the die to the DAP via the conductive bonding layer. As discussed, the die is configured for a clip bond. For example, the top of the die includes a dielectric passivation layer 633 with one or more pad openings to expose a top die contact pad. As shown, the passivation layer includes a pad opening to expose a top die contact pad 634. More than one pad openings to expose more than one top die contact pads may also be useful.

As shown in FIG. 6d, the process continues to deposit a clip-die bonding layer 145 with spacers on the top die contact pad 634 and a clip-substrate bonding layer 155 with spacers on a bond pad 114 of interest. The bond pad of interest is the one designated for coupling to the top die contact pad. In the case of more than one top die contact pads, clip-die bonding layers are deposited on respective top die contact pads and clip-substrate bonding layers are deposited on respective bond pads. The bonding layer may be deposited similarly as previously discussed.

Referring to FIG. 6e, a clip bond 1801 is mounted onto the package substrate and die. In the case of a die stack application, the clip bond 1801 may be referred to as the first clip bond. The first clip bond is mounted onto the die 130 and the bond pad. The first clip bond is temporarily mounted onto the package substrate and die. As shown, only one first clip bond is mounted onto the package substrate and die. More than one first clip bond may be mounted on the package substrate and die.

After mounting the first clip bond, as shown in FIG. 6f, a clip-die bonding layer 165 with spacers is deposited thereon. In the case of multiple first clip bonds, multiple clip-die bonding layers may be deposited on respective first clip bonds. The clip-die bonding layer or layers may be deposited similarly as previously described.

Figure 6G:
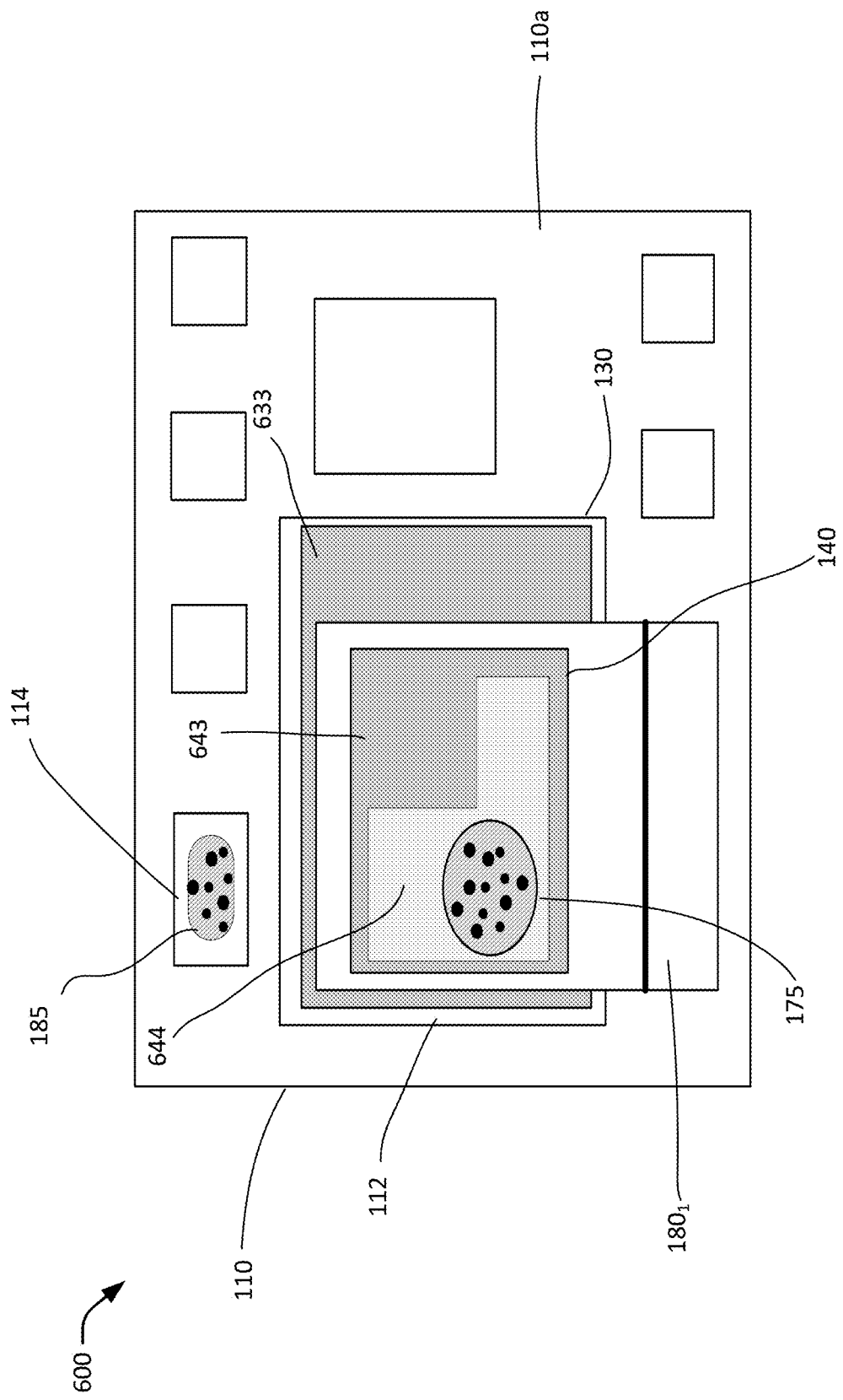

In FIG. 6g, a second die 140 is temporarily attached to the first clip bond via the clip-die bonding layer. The second die includes a passivation layer 643 on the top surface (i.e., the surface opposing the mounting surface of the first clip bond) with a pad opening to expose the top die contact pad 644 of the second die. A second clip-die bonding layer 175 is deposited on the top die contact pad of the second die and a second clip-substrate bonding layer 185 is deposited on a respective bond pad 114 of the substrate. In the case of more than one top die contact pads on the second die, clip-die bonding layers are deposited on respective top die contact pads and clip-substrate bonding layers are deposited on respective bond pads. The bonding layer may be deposited similarly as previously discussed.

Figure 6H:
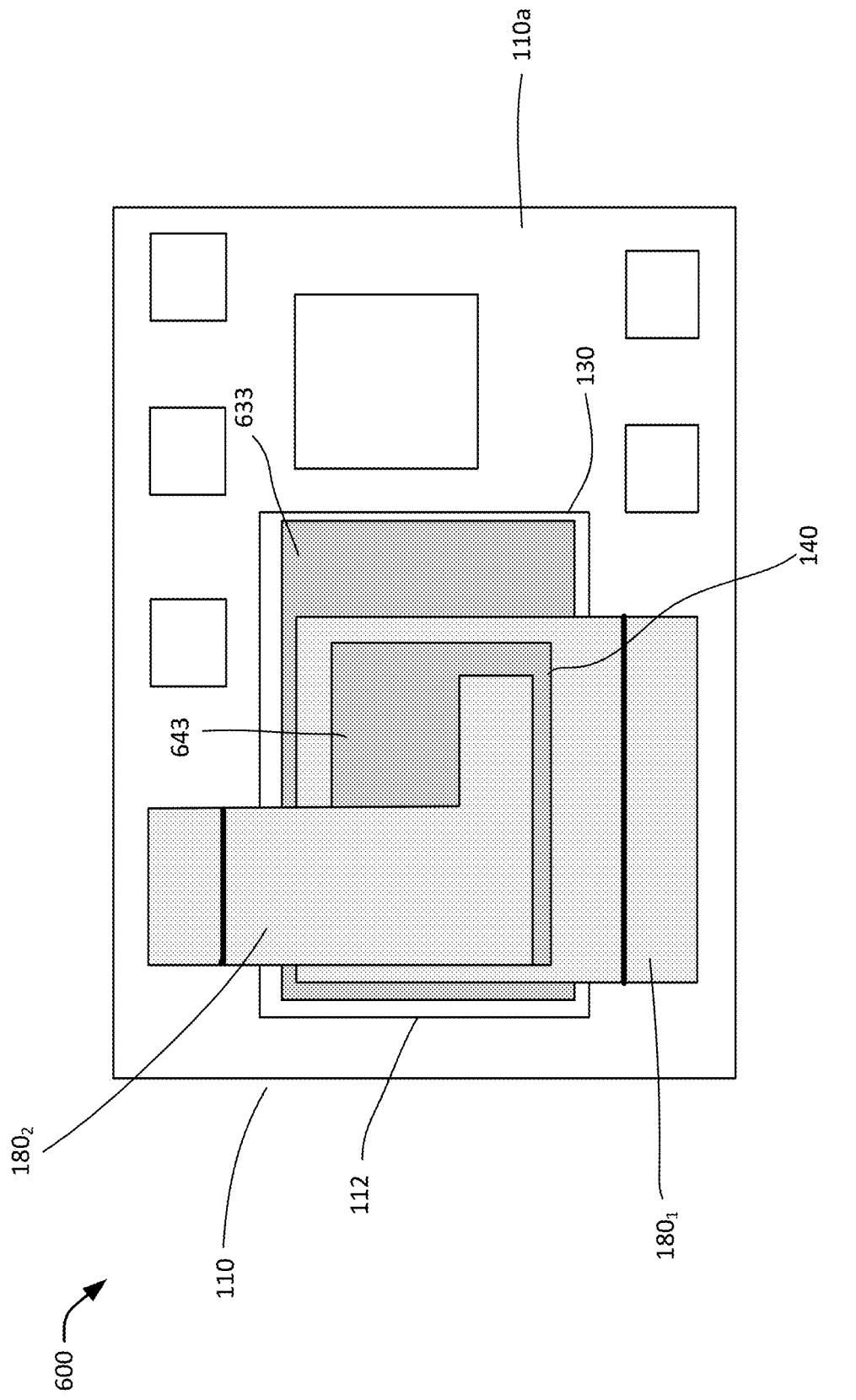

Referring to FIG. 6h, a second clip bond 1802 is mounted onto the package substrate and the second die. The second clip bond is temporarily mounted onto the package substrate and the second die. As shown, only one second clip bond is mounted onto the package substrate and the second die. More than one second clip bonds may be mounted on the package substrate and the second die.

After bonding the second clip bonds, the package substrate is processed to permanently bond the dies and clip bonds. For example, a reflow process is performed on the bonding layers to permanently bond the dies and clip bonds in the case that the bonding layers are a solder paste, or a curing process is performed in the case the bonding layers are a sintered paste. For a sintering paste, the curing process may be performed in either a curing oven or a reflow oven. In the case both solder paste and sinter paste are used, separate processes are performed.

The process may continue to complete processing of the package. For example a cap may be formed on the package substrate, encapsulating the dies and bonds. Additional processes may be performed, such as singulating the devices from the lead frame. Other processes may also be performed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a first die with first and second die surfaces, the second die surface is bonded to a first die attach pad (DAP) disposed on a first substrate surface of a package substrate and the first die surface includes a first die contact pad;
   a first clip bond, wherein the first clip bond includes
      a first clip bond horizontal planar portion attached to the first die contact pad on the first die surface, and
      a first clip bond vertical portion disposed on an edge of the first clip bond horizontal planar portion, the first clip bond vertical portion is attached to a first substrate bond pad on the first substrate surface; and
   a first conductive clip-die bonding layer with spacers dispersed therein, the first conductive clip bonding layer is disposed on the first die contact pad of the first die, the first conductive clip-die bonding layer bonds the first clip bond horizontal planar portion to the first die contact pad, wherein the spacers comprise a spacer size which is less than a Bond Line Thickness (BLT) of the first conductive clip-die bonding layer, the spacers facilitate in maintaining a uniform BLT.

2. The device in claim 1 wherein the first clip bond vertical portion comprises a step profile.

3. The device in claim 1 wherein the first clip bond vertical portion comprises a base having an extension portion along a plane of the first substrate bond pad.

4. The device in claim 1 further comprises a first conductive die-substrate bonding layer with spacers, wherein the first conductive die-substrate bonding layer bonds the first clip bond vertical portion of the first clip bond to the first substrate bond pad.

5. The device in claim 4 wherein the bonding layers are screen printed.

6. The device in claim 4 wherein the spacers comprise a material having a higher melting point than the first conductive clip-die bonding layer.

7. The device in claim 4 wherein the spacers have a size equal to or smaller than the Bond Line Thickness (BLT).

8. The device in claim 4 further comprises
   a second die with first and second die surfaces, the second die surface is bonded to the first clip bond horizontal planar portion by a second conductive clip-die bonding layer with spacers and the first die surface includes a second die contact pad;
   a second clip bond, wherein the second clip bond includes
      a second clip bond horizontal planar portion attached to the second die contact pad on the first die surface, and
      a second clip bond vertical portion disposed on an edge of the second clip bond horizontal planar portion, the second clip bond vertical portion is attached to a second substrate bond pad on the first substrate surface; and
   a third conductive clip-die bonding layer with spacers on the second die contact pad of the second die, the third conductive clip-die bonding layer bonds the second clip bond horizontal planar portion to the second die contact pad.

9. The device in claim 8 further comprises a second conductive die-substrate bonding layer with spacers, wherein the second conductive die-substrate bonding layer bonds the second clip bond vertical portion to the second substrate bond pad.

10. The device in claim 4 further comprises
    a second die with first and second die surfaces, the second die surface is attached to a second DAP disposed on the first substrate surface and the first die surface includes a second die contact pad; and
    a second conductive clip-die bonding layer with spacers on the second die contact pad of the second die, the second conductive clip-die bonding layer bonds the first clip bond horizontal planar portion to the second die contact pad.

11. The device in claim 10 wherein the first clip bond comprises 2 first clip bond vertical portions disposed on opposing edges of the first clip bond horizontal planar portion.

12. The device in claim 11 wherein the 2 first clip bond vertical portions are attached to the first substrate bond pad and a second substrate bond pad respectively.

13. The device in claim 1 wherein the first die is a MOSFET die having source, drain and gate terminals.

14. A device comprising:
    a first die with first and second die surfaces, the second die surface is bonded, by a conductive die-substrate bonding layer, to a first die attach pad (DAP) disposed on a first substrate surface of a package substrate and the first die surface includes a first die contact pad;
    a first clip bond, wherein the first clip bond includes
       a first clip bond horizontal planar portion attached to the first die contact pad on the first die surface, and
       a first clip bond vertical portion disposed on an edge of the first clip bond horizontal planar portion, the first clip bond vertical portion is attached to a first substrate bond pad on the first substrate surface by a first conductive clip-substrate bonding layer;
    a first conductive clip-die bonding layer with spacers on the first die contact pad of the first die, the first conductive clip-die bonding layer bonds the first clip bond horizontal planar portion to the first die contact pad;
    a second die with first and second die surfaces, the second die surface is bonded to the first clip bond horizontal planar portion by a second conductive clip-die bonding layer with spacers and the first die surface includes a second die contact pad;
    a second clip bond, wherein the second clip bond includes
       a second clip bond horizontal planar portion attached to the second die contact pad on the first die surface, and
       a second clip bond vertical portion disposed on an edge of the second clip bond horizontal planar portion, the second clip bond vertical portion is attached to a second substrate bond pad on the first substrate surface; and a third conductive clip-die bonding layer with spacers on the second die contact pad of the second die, the third conductive clip-die bonding layer bonds the second clip bond horizontal planar portion to the second die contact pad.

15. The device in claim 14 wherein the first conductive clip-substrate bonding layer and the conductive die-substrate bonding layer comprise spacers.

16. The device in claim 15 wherein the spacers have a size equal to or smaller than a Bond Line Thickness (BLT).

17. The device in claim 15 wherein the spacers comprise a material having a higher melting point than the bonding layers.

18. A device comprising:

a first die with first and second die surfaces, the second die surface is bonded to a first die attach pad (DAP) disposed on a first substrate surface of a package substrate and the first die surface includes a first die contact pad;

a first clip bond having a horizontal planar portion attached to the first die contact pad on the first die surface; and a first conductive clip-die bonding layer with spacers dispersed therein, the first conductive clip bonding layer is disposed on the first die contact pad of the first die, the first conductive clip-die bonding layer bonds the first clip bond horizontal planar portion to the first die contact pad, wherein the spacers comprise a spacer size which is less than a Bond Line Thickness (BLT) of the first conductive clip-die bonding layer, the spacers facilitate in maintaining a uniform BLT.

19. The device in claim 18 wherein the spacer size is about 50-90% of the BLT.

20. The device in claim 19 wherein the spacers comprise a material having a higher melting point than the bonding layers.

* * * * *